US008047518B2

(12) United States Patent
Grange et al.

(10) Patent No.: US 8,047,518 B2

(45) Date of Patent: Nov. 1, 2011

(54) DEVICE FOR POSITIONING AN OBJECT IN ALL DIRECTIONS

(75) Inventors: Matthieu Grange, Chavannes (CH); Arnaud Casagrande, Lignière (CH)

(73) Assignee: The Swatch Group Research and Development Ltd, Marin (CH)

( * ) Notice: Subject to any disclaimer, the term of this patent is extended or adjusted under 35 U.S.C. 154(b) by 354 days.

(21) Appl. No.: 12/306,313

(22) PCT Filed: Jun. 6, 2007

(86) PCT No.: PCT/EP2007/055604

§ 371 (c)(1), (2), (4) Date: Dec. 23, 2008

(87) PCT Pub. No.: WO2007/147737

PCT Pub. Date: Dec. 27, 2007

(65) Prior Publication Data

US 2009/0238668 A1 Sep. 24, 2009

(30) Foreign Application Priority Data

Jun. 23, 2006 (EP) .................................... 06116000

(51) Int. Cl.

*B23Q 3/00* (2006.01)
*B23Q 3/18* (2006.01)
*B25B 1/22* (2006.01)
*G01R 29/10* (2006.01)
*B62M 1/00* (2010.01)

(52) U.S. Cl. .................... 269/289 MR; 269/59; 269/71; 269/75; 269/290; 343/703; 280/87.042

(58) Field of Classification Search .................... 269/59, 269/71, 75, 289 R, 290; 343/703; 280/87.042
See application file for complete search history.

(56) References Cited

U.S. PATENT DOCUMENTS 3,441,936 A 4/1969 Heine
4,764,668 A 8/1988 Hayard
4,901,073 A 2/1990 Kibrick
(Continued)

FOREIGN PATENT DOCUMENTS

FR 2 590 681 A1 5/1987
(Continued)

OTHER PUBLICATIONS

International Search Report issued in corresponding application No. PCT/EP2007/055604, completed Aug. 14, 2007 and mailed Aug. 28, 2007.

(Continued)

*Primary Examiner* — Monica Carter
*Assistant Examiner* — Seahee Yoon
(74) *Attorney, Agent, or Firm* — Griffin & Szipl, P.C.

(57) ABSTRACT

The positioning device can position a spherical object. This object is placed and held by gravity on three points of support (P, P', P") of the positioning device. The center of gravity of the object in any position is within the triangle formed by the three points of support. The positioning device includes means for driving the object in rotation. The drive means includes a drive member including wheel whose contact with the external surface of the object forms one of the support points (P) of the positioning device. This drive member can impose a rotation on the object, via the wheel, in all directions. The other two points of support (P', P") are made using two ball and socket joints, wherein the ball is held on an air cushion in a housing of the ball and socket joint.

6 Claims, 4 Drawing Sheets

U.S. PATENT DOCUMENTS

| | | | | |
|---|---|---|---|---|
| 5,507,605 | A * | 4/1996 | Bae | 408/89 |
| 6,087,941 | A | 7/2000 | Ferraz | |
| 6,191,744 | B1 | 2/2001 | Snow et al. | |
| 6,329,953 | B1 | 12/2001 | McKivergan | |
| 6,850,851 | B1 | 2/2005 | Fourestie et al. | |
| 7,035,594 | B2 | 4/2006 | Wallace et al. | |
| 7,167,133 | B2 | 1/2007 | Nagashima | |
| 2003/0151184 | A1* | 8/2003 | Wiebe | 269/75 |
| 2005/0176375 | A1 | 8/2005 | Bednaz et al. | |
| 2006/0049595 | A1* | 3/2006 | Crigler et al. | 280/87.042 |
| 2009/0231217 | A1* | 9/2009 | Grange et al. | 343/703 |

FOREIGN PATENT DOCUMENTS

| | | |
|---|---|---|
| GB | 1 188 578 | 4/1970 |
| GB | 2 234 877 A | 2/1991 |
| JP | 2003-43083 | 2/2003 |
| WO | 97/25239 | 7/1997 |

OTHER PUBLICATIONS

Notice of Allowance issued in co-pending related U.S. Appl. No. 12/306,300, dated Mar. 31, 2011.

* cited by examiner

DEVICE FOR POSITIONING AN OBJECT IN ALL DIRECTIONS

This is a National Phase Application in the United States of International Patent Application No. PCT/EP2007/055604 filed Jun. 6, 2007, which claims priority on European Patent Application No. 06116000.8, filed Jun. 23, 2006. The entire disclosures of the above patent applications are hereby incorporated by reference.

FIELD OF THE INVENTION

The invention concerns a device for positioning an object in all directions. The object is configured to have at least one portion that is in the form of a spherical dome, to be placed on the positioning device. The object, with its spherical dome, is held by gravity on three support points of the positioning device. The positioning device further includes means for driving the object in rotation. The centre of gravity of the object in any position or orientation is inside the triangle formed by the three support points.

BACKGROUND OF THE INVENTION

The use of positioning devices, particularly for systems measuring the radiation diagram of a transmitting antenna, is known. This positioning device can orient, for example, the transmitting antenna, in all directions relative to a fixed receiving antenna, with well-known features of a receiver device. This receiver device, which is connected to a data processing station, can pick up the electromagnetic field generated by the transmitting antenna some distance away, in every position or orientation of the antenna. In this way, the processing station can determine the radiation diagram of the transmitting antenna so as to determine the features of the antenna.

The transmitting antenna to be measured can be placed in a spherical element, so that the spherical element can be held by gravity, for example, on three support points of a positioning device. This positioning device of the prior art includes three drive wheels. The contact of each wheel on the external surface of the spherical element constitutes one of the three support points. These drive wheels can be small tyres, which are each set in motion by drive wheels, such as compressed air turbines or motors. The driving of the wheels causes the spherical element, in contact with the wheels, to rotate randomly in three directions.

With the use of three drive wheels, the positioning device of the prior art has some drawbacks. Indeed, when the three drive wheels rotate, the movement, which they communicate to the spherical element, involves a movement tangential to the support points, i.e. to the three contact points. This movement is the result of three wheel friction forces. In other words, the wheels skid most of the time on the external surface of the moving spherical element. The effect of this is to animate the spherical element in a chaotic manner.

The various frictions act like rubbers on the external surface of the spherical element, dirtying the external surface of the spherical element. Since, in some cases, the tangential movement of the sphere is exactly orthogonal to the orientation of one of the wheels, this therefore means that the spherical element jumps around its origin. This momentary deviation of the centre of the sphere, leads to an error in the measured position or orientation of the transmitting antenna, which constitutes a drawback. Moreover, during the various jumps, the spherical element, which may be off-balance, has a marked tendency to fall back along its mass centre. This results in a lack of homogeneity in the positions travelled.

U.S. Pat. No. 3,441,936 describes a device for positioning a spherical element in which a transmitting antenna can be placed. This spherical element is held, by gravity, on three drive wheels of the positioning device that are capable of orienting the transmitting antenna in any direction. When one drive wheel is being driven, in order to move the spherical element, the spherical element skids or jumps onto the other two drive wheels. This means that proper positioning of the transmitting antenna cannot be guaranteed, which is a drawback.

SUMMARY OF THE INVENTION

It is thus an object of the invention to provide a device for positioning an object in all directions that can overcome the aforecited drawbacks of the state of the art.

This object is attained according to the invention with the characteristics of a device for positioning an object in all directions in that the object is configured to have at least one portion in the shape of a spherical dome, which is placed and held by gravity on three points of support P, P', P" of the positioning device 2, the positioning device including means for driving the object in rotation, wherein the centre of gravity of the object in any position or orientation is within the triangle formed by the three points of support, the drive means including a drive member 20, 21, 22, such as a wheel, whose contact with the external surface of the spherical dome forms one of the points of support of the positioning device, the member being configured to drive the object in all directions on the positioning device, characterized in that the two other points of support of the positioning device are each formed by a ball and socket joint 30, 40, respectively, wherein the ball 31 is placed to rotate freely in an end housing 32 of the ball and socket joint, so that one portion of the ball emerges through an aperture in the housing to come into contact with the external surface of the spherical element 3. Additional, particularly beneficial, embodiments of the invention are provided in accordance with the following subsidiary positioning devices.

In accordance with a second positioning device embodiment of the invention, the first embodiment is modified so that the drive member 20 is a wheel 21 that comes into contact with the external surface of the spherical dome to drive the dome in rotation, the rotating axle of the wheel is mounted at the end of a support 22 that can rotate along another axle, which passes through the point of contact of the wheel on the external surface of the object and the centre of the sphere, defined by the spherical domed shaped portion of the object so as to impose a rotation on the object via the wheel, in every direction. In accordance with a third positioning device embodiment of the invention, the first embodiment is modified so that the portion of the ball and socket joint that houses the ball is a nozzle, for bringing compressed air, so that the ball is held in the housing on an air cushion. In accordance with a fourth positioning device embodiment of the invention, the second embodiment is modified so that the wheel takes the form of a pulley that has a rubber ring in a circular groove of the pulley. In accordance with a fifth positioning device embodiment of the invention, the second embodiment is modified so that a pneumatic motor 23 is mounted on the support in proximity to the wheel of the drive member to drive the wheel in rotation about the rotating axle thereof. In accordance with a sixth positioning device embodiment of the invention, the first embodiment is modified so that the object is a spherical element 3, arranged on the three points of support P, P', P'', characterized in that that an additional pressure ball and socket joint 80 is provided above and in contact with the spherical element to increase the weight of the spherical element on the three points of support. In accordance with a seventh positioning device embodiment of the invention, the sixth embodiment is modified so that the additional pressure ball and socket joint 80 includes a ball that slides into a compressed air pipe to generate a constant force on the spherical element.

One advantage of the positioning device according to the invention is, generally, that only one drive member is used for driving the object placed on the three support points in rotation. This drive member can drive the object, which may preferably be a spherical element, randomly, in any direction along the orientation of the drive member.

Advantageously, the drive member includes a wheel that is in contact with the external surface of the spherical element and a support for this drive wheel. The rotating axle of the wheel is mounted at the end of the support, which is able to rotate along another axle passing through the point of contact of the wheel on the external surface of the spherical element and the centre of the spherical element. The wheel can be configured like a pulley, in one circular groove of which there is placed a rubber ring, which comes into contact with the external surface of the spherical element. The support is rotatably mounted on a mechanical structure of the positioning device, and the drive wheel can be driven in rotation via compressed air means, such as a compressed air turbine or motors.

BRIEF DESCRIPTION OF THE DRAWINGS

The objects, advantages and features of the device for positioning an object will appear more clearly in the following description, with reference to the drawings, in which.

DETAILED DESCRIPTION OF THE ILLUSTRATIVE EMBODIMENTS

In the following description, all of the elements of the positioning device, which are well known to those skilled in this technical field, will only be explained in a simplified manner. The object placed on the positioning device could be a lamp, a loudspeaker, an indicator, a decorative object or work of art, a support for an electronic device, or any other object. This object includes at least one portion in the form of a spherical dome that can be placed and held on the positioning device.

Figure 1:
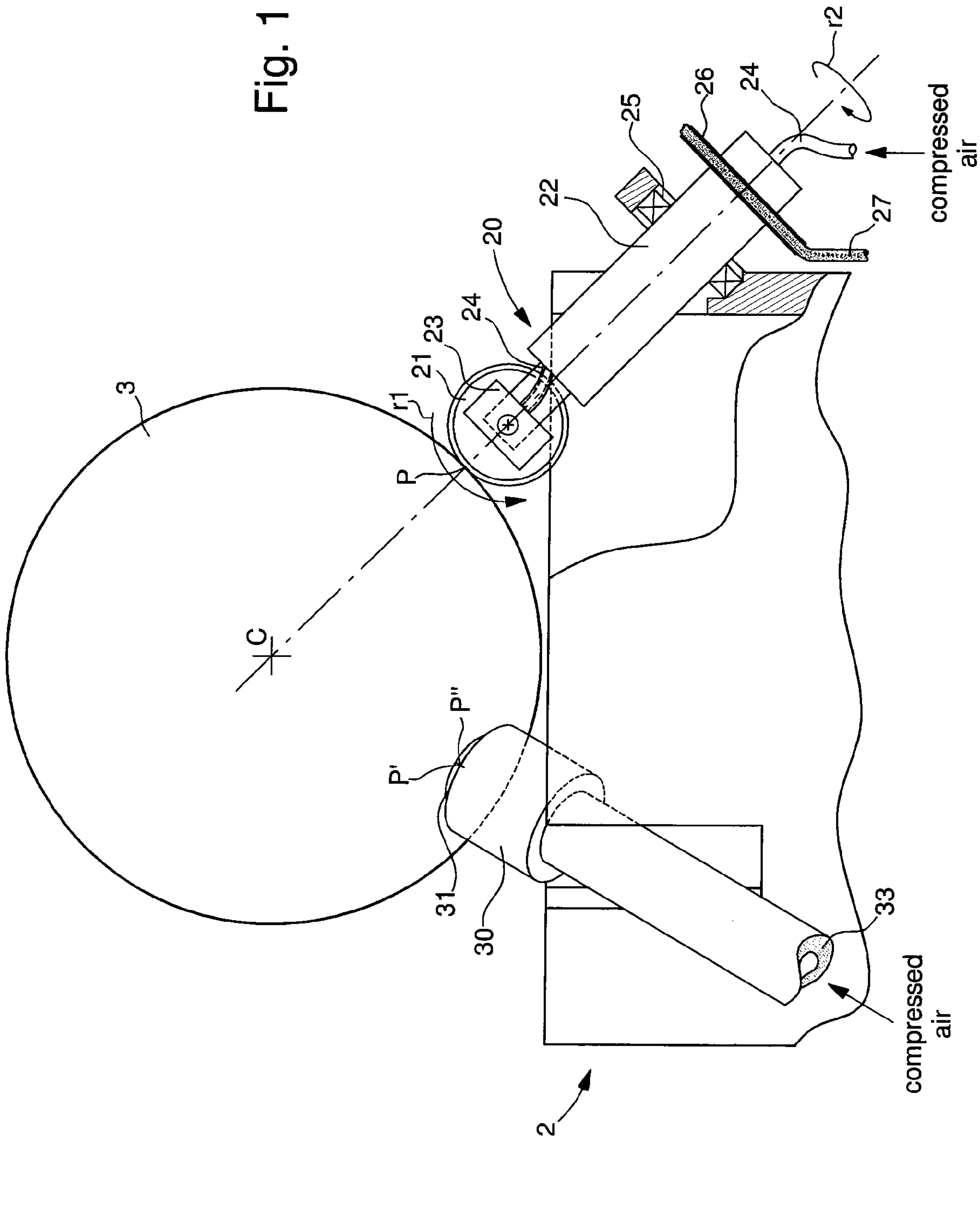
FIG. 1 shows, partially in cross-section, one part of the positioning device according to the invention, on which a spherical object is placed.

FIG. 1 shows the main elements of the positioning device 2, on which an object with a spherical dome 3, can be placed on three support points P, P', P''. The object is preferably a hollow spherical element that acts as a support for an electronic device.

Mounted on a mechanical structure, positioning device 2 includes a drive member 20, which is in contact with the external surface of the spherical element, to form a first support point P, and two ball and socket joints 30, 40, only one of which is visible in FIG. 1. The second ball and socket joint 40 is visible in FIG. 4. These ball and socket joints are explained below with reference to FIGS. 3*a* and 3*b*. The ball 31 of each ball and socket joint 30, 40 comes into contact with the external surface of the spherical element to form the other two points of support P' and P'' of the positioning device. This drive member is configured so that it can rotate spherical element 3 randomly in all directions on the positioning device.

Figure 2:
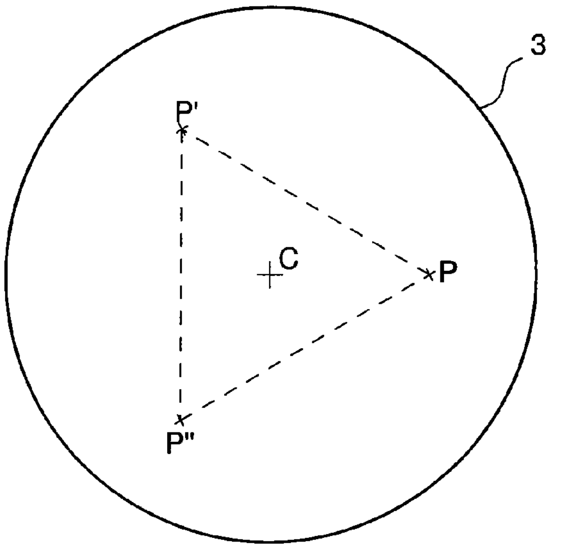
FIG. 2 shows a spherical object with the location of the points of support of the positioning device according to the invention.

As shown in FIG. 2, the three support points P, P', P'' can be regularly spaced to form the ends of a triangle, for example an equilateral triangle, which is preferably arranged horizontally. Of course, the centre of gravity of spherical element 3 must be in any position within the equilateral triangle in order to be held on the positioning device. The space between each support point must preferably be more than the radius of the spherical element and less than 1.5 times the radius of the spherical element.

Drive member 20 is formed of a wheel 21, which comes into contact with the external surface of the spherical element to drive the element in rotation. The wheel can include a ring element made of rubber and arranged in a circular groove of a pulley for driving the spherical element without slipping. The rotating axle r1 of wheel 21 is mounted at the end of a support 22 or rod. This support 22 is able to rotate along another axle of rotation r2, which passes through the point of contact P of the wheel on the external surface of the spherical element, and the centre C of the element. The support is held in the mechanical structure of the positioning device, for example, via a ball bearing 25, to enable the support to rotate along its rotating axle. This means that a random rotation can be imposed on the spherical element via the wheel 21, in all directions.

Instead of the three drive wheels of a prior art device, which formed the three points of support for the spherical element, the single drive wheel 21 no longer skids on contact with the external surface of the spherical element. This allows spherical element 3 to randomly describe the entire position space, with a high degree of homogeneity. This drive wheel is preferably driven by a motor 23 or compressed air turbine, which can be arranged directly on the rotating axle of the wheel and fixedly held to the end of support 22. Of course, motor 23 may also be housed in the support in proximity to the wheel 21, and connected to the rotating axle of the wheel by a set of gears. This gear set can perform a reduction of the rotational speed of pneumatic motor 23. At least one flexible conduit or pipe 24 connects compressed air motor 23 to a compressed air tank (not shown) to transport the air.

Another compressed air motor or turbine can be used for driving support 22 of drive wheel 21 in rotation. In such case, support 22 includes a pulley 26 at the opposite end of drive wheel 21. A belt 27 connects the pulley 26 to at least one other pulley (not shown), which is driven by the other motor or turbine, or another set of gears. Via this arrangement, support 22 can be driven in rotation in order to make the rotating axle of the drive wheel 21 rotate. With this single drive wheel, the spherical element no longer jumps on the three points of support. The only observed movement of the spherical element away from the centre is due to its natural out-of-roundness and the play of the pulleys, of the order of a millimeter.

Figure 3A:
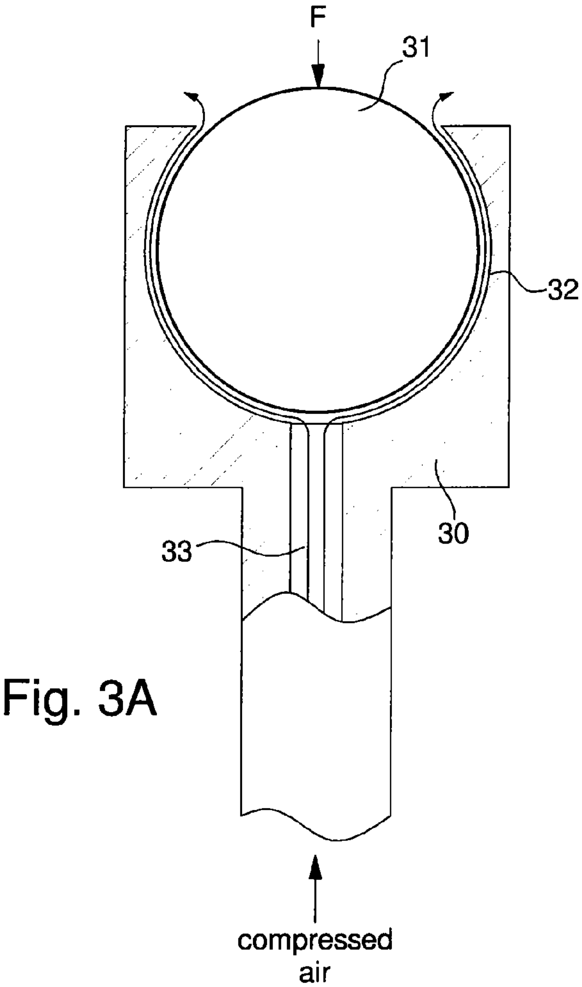
FIGS. 3*a* and 3*b* show a partial cross-section lengthways and a top view of a ball and socket joint of the positioning device according to the invention.
Figure 3B:
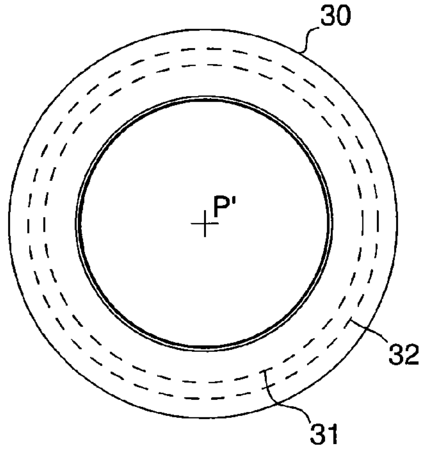

FIGS. 3*a* and 3*b* show one of the ball and socket joints 30 of the positioning device to be used as one of the points of support for the spherical element. This ball and socket joint 30, which can be of generally cylindrical external shape, includes a housing 32 for a synthetic ball. The housing is sized such that the ball is free to rotate inside the housing. The housing may be spherical or cylindrical. Preferably, the ball and socket joint is made of a non-conductive material with a low friction coefficient, such as Teflon, for the freely rotating ball.

One portion of ball 31 emerges from housing 32 via a top aperture in ball and socket joint 30 to come into contact with the external surface of the spherical element. A force F, representing one part of the weight of the spherical element, is applied to point of support P' on the ball. The diameter of this aperture is smaller than the diameter of the ball, so that the ball is held inside housing 32.

For a housing of spherical shape, the ball and socket joint includes two parts that fit onto each other lengthways to trap the ball in the housing. In the case of a cylindrical housing, however, the top aperture is made in a cover (not shown), which partially closes the housing. The ball and socket joint is also configured in the form of a nozzle, to bring compressed air, via a pipe 33 in the ball and socket joint, right into the ball housing 32. Thus, the ball is held in its housing on an air cushion.

If spherical element 3 is placed only on two compressed air nozzles, whose flow is regulated, whereas the third point of support is the drive wheel, it is easy to make the spherical element float and rotate. However, in some cases, an oscillating movement animates the spherical element. The element moves closer to a nozzle, which increases the air pressure and ejects it slightly. If the local pressure, and thus the supporting force, decreases, then the spherical element falls back onto the nozzle, which then ejects it again. Consequently, with compressed air nozzles, the air pressure has to be regulated in accordance with the weight of the sphere, which is resolved by the ball and socket joints according to the invention. A thread of compressed air comes out of the housing aperture around the ball, whose pressure depends upon the weight of the spherical element, which avoids the problems of simple compressed air nozzles. The spherical element can be driven freely in rotation without surges in every direction.

Figure 5:
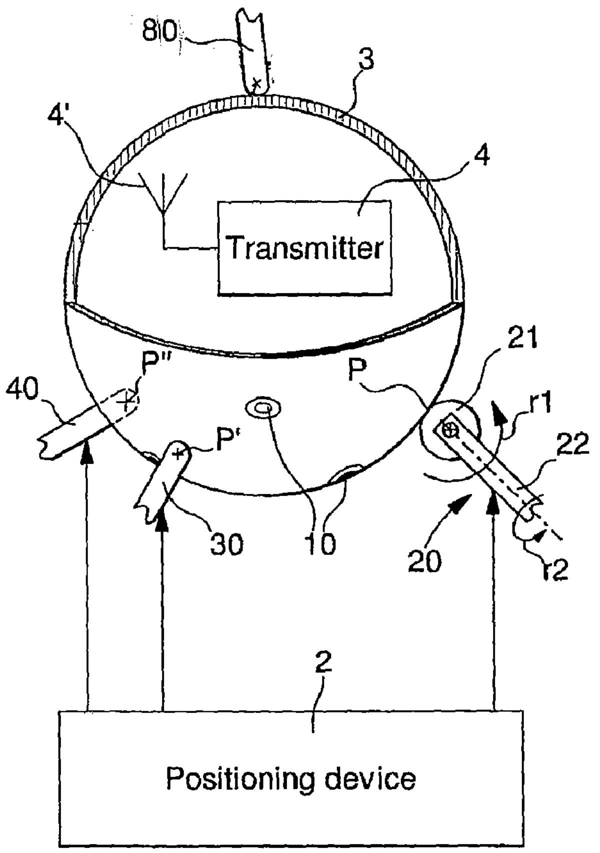
FIG. 5 shows a preferred embodiment of the invention in which an additional ball and socket joint 80 is disposed in order to increase the weight of the spherical element on the three support points P, P', P''.

In order to overcome any problem linked to lack of balance of the spherical element on the three points of support, the weight of the spherical element can be increased by introducing an additional ball and socket joint 80 as shown in FIG. 5, or a pressure spherical joint to the tip of the sphere. This ball and socket joint 80 can be made using a ball that slides in a compressed air tube and generates a constant force on the spherical element, like a spring. The resultant of this normal pressure in contact with the drive wheel enables the wheel to adhere better.

Figure 4:
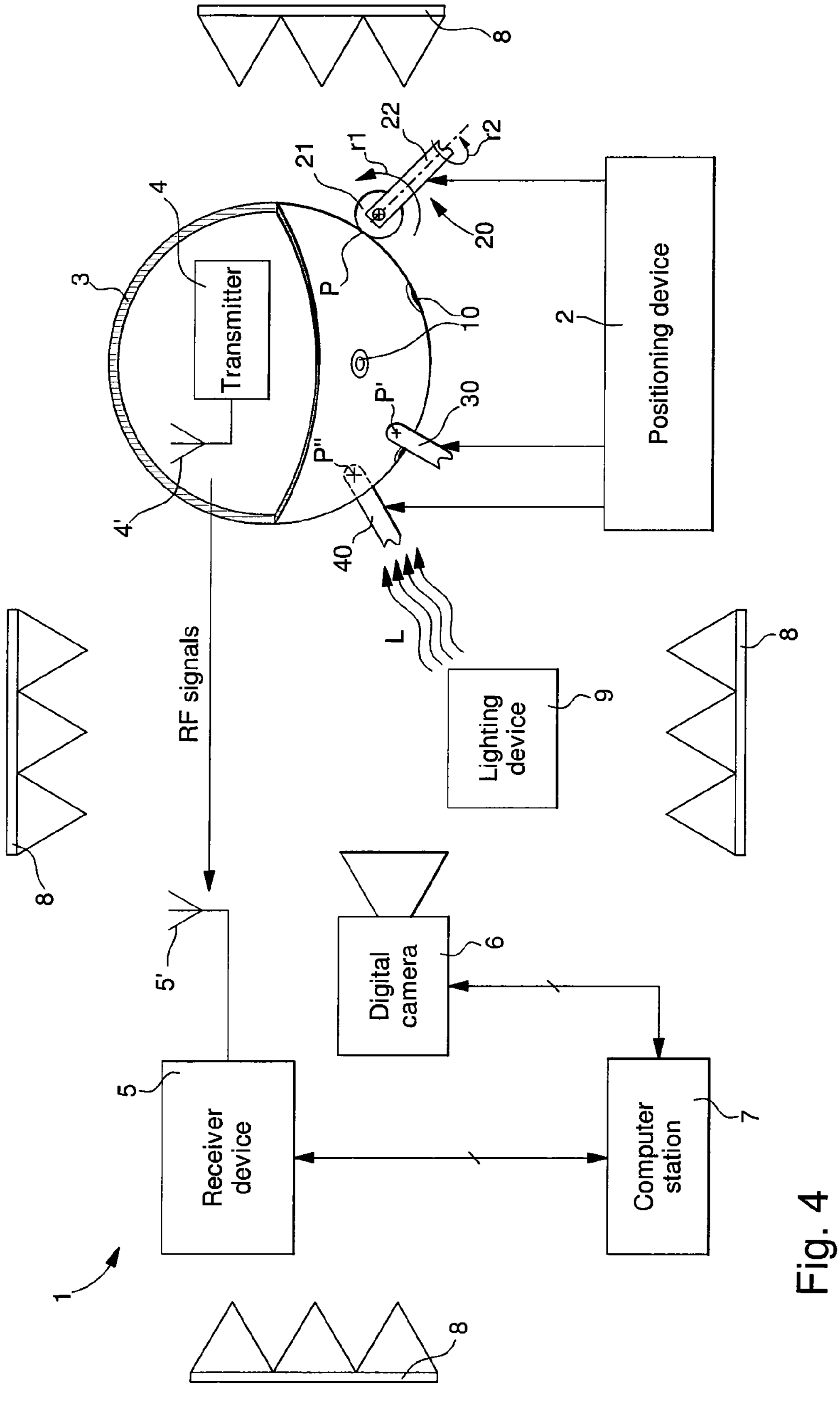
FIG. 4 shows, in a simplified manner, the various elements, which form a system for measuring the radiation diagram of a transmitting antenna, which includes a positioning device according to the invention.

FIG. 4 shows schematically all of the elements of a system 1 for measuring the radiation diagram of a transmitting antenna 4' of an electronic transmitter device 4, which includes positioning device 2 of the invention. For the sake of simplification, positioning device 2 is only represented in FIG. 4 by drive member 20, and ball and socket joints 30, 40, which carry an object, via gravity, such as a spherical element 3. Drive member 20 can rotate the spherical element randomly in all directions.

Electronic device 4 with its transmitting antenna 4' are housed and fixedly held inside spherical element 3, which includes two parts, which fit one on top of the other, by any known means, to trap the electronic device. Transmitting antenna 4' is preferably positioned close to the centre of the hollow sphere, for measuring the electromagnetic field generated by the transmitting antenna of the measuring system.

The measuring system further includes a receiver device 5, provided with at least one receiving antenna 5' for picking up the electromagnetic field from transmitting antenna 4' (RF signals), and means 6 for detecting the position or orientation of the spherical element that is moving on positioning device 2. The signals relating to the electromagnetic field picked up by the receiving antenna and position signals provided by the detecting means are transmitted, either automatically or upon demand, to a data processing station, which is preferably a computer station 7. Receiver device 5 and the detecting means, which are formed by a digital camera 6, can be electrically powered independently of the computer station or via the computer station.

Most of the components of the measuring system 1 are placed inside an anechoic chamber, illustrated by the elements referenced 8 in FIG. 1. This prevents any reflection of the electromagnetic field generated by transmitting antenna 4' onto obstacles that might be detrimental to the transmitting antenna radiation measurement. Moreover, none of the parts of the positioning device 2 in proximity to the transmitting antenna, i.e. inside the chamber, must be made of metal material, so that they do not interfere with measurement of the electromagnetic field generated by the transmitting antenna. The drive means for positioning device 2, which are made of plastic or of a non-conductive material, operate using compressed air. These drive means may be motors or compressed air turbines, connected by pipes with taps to a compressed air tank. These non-metal motors for driving the wheel and wheel support along two axles, can thus be placed in proximity to the transmitting antenna.

In order to determine precisely the position or orientation of spherical element 3, and thus the transmitting antenna 4' that it contains and which has to be measured, specific figures or references 10 are placed on the external surface of spherical element 3. These figures and references are formed by circular barcodes, with each circular barcode defining a precise position of the spherical element 3 on the positioning device 2. Each circular barcode 10 can be printed or bonded onto the external surface of the sphere or made by any other means.

There are, for example, 14 different circular barcodes, which are uniformly distributed over the external surface of the spherical element. Each circular barcode is encoded in 4 bits, and one external delimiting bit of a different colour to the external surface of the spherical element. The external surface of the spherical element is preferably light coloured, for example white, whereas at least one additional external delimiting bit is dark coloured, for example, black.

In order to improve the images captured by the digital camera, which must be able to take, for example, 15 images per second, measuring system 1 further includes an isotropic lighting device 9. This lighting device 9 is configured so as to provide light beams L in the direction of at least half of the external surface of spherical element 3 on the side of digital camera 6. This lighting device can be formed by a set of optical fibers that guide light from an external light source to the surface of the anechoic chamber of the spherical element that is visible to the digital camera.

In sum then, the positioning device 2, in accordance with the present invention, can position or orient a spherical object 3 as shown in FIG. 1. This spherical object is placed and held by gravity on three points of support P, P', P" of the positioning device 2. The positioning device 2 incudes means for driving the object in rotation. The centre of gravity of the object in any position or orientation is within the triangle formed by the three points of support. The drive means include a drive member 20, 21, 22 whose contact with the external surface of the object or spherical element forms one of the support points P of the positioning device. The drive member includes a drive wheel, which comes into contact with the external surface of the spherical object to drive the object in rotation. The rotating axle of the wheel is mounted at the end of a support 22, which can rotate along another axle passing through the point of contact P of the wheel on the external surface of the spherical object and the centre of the object. This drive member can thus impose a rotation on the object, via the wheel, in all directions. The other two points of support P', P" are made using two ball and socket joints 30, 40, as shown in FIG. 4, wherein the ball is held on an air cushion in a housing of the ball and socket joint.

From the description that has just been given, those skilled in the art can devise multiple variants of the device for positioning object in all directions, without departing from the scope of the invention, as defined by the claims.

The invention claimed is:

1. A device for positioning an object in all directions, wherein the object is a spherical element which is placed and held by gravity on three points of support of the positioning device, wherein the centre of gravity of the object in any position or orientation is within the triangle formed by the three points of support of the positioning device, the positioning device including:

(a) means for driving the object in rotation, forming one of the three points of support of the positioning device, wherein the means for driving the object in rotation includes a wheel, wherein the wheel is arranged to drive the object in rotation in all directions on the positioning device to come into contact with an external surface of the spherical element and thus to form one of the three points of support of the positioning device;

(b) a ball and socket joint, forming each of the two other points of support of the positioning device, wherein the ball is placed to rotate freely in an end housing of the ball and socket joint, wherein one portion of the ball is arranged to emerge through an aperture in the end housing to come into contact with the external surface of the spherical element and thus to form each of the two other points of support of the positioning device; and (c) an additional ball and socket joint in contact with the spherical element to increase the weight of the spherical element on the three points of support of the positioning device.

2. The positioning device according to claim 1, wherein a rotating axle of the wheel is mounted at the end of a support that can rotate along another axle, which passes through the point of contact of the wheel on the external surface of the spherical element and the centre of gravity of the spherical element so as to impose a rotation on the object via the wheel, in every direction.

3. The positioning device according to claim 1, wherein the ball and socket joint is in the form of a nozzle, for bringing compressed air, so that the ball is held in the end housing on an air cushion.

4. The positioning device according to claim 2, wherein the wheel is in the form of a pulley that has a rubber ring in a circular groove of the pulley.

5. The positioning device according to claim 2, wherein a pneumatic motor is mounted on the support in proximity to the wheel to drive the wheel in rotation about the rotating axle thereof.

6. The positioning device according to claim 1, wherein the additional ball and socket joint includes a ball that slides into a compressed air pipe to generate a constant force on the spherical element.

* * * * *